United States Patent
Campbell et al.

(10) Patent No.: US 11,474,578 B2
(45) Date of Patent: Oct. 18, 2022

(54) DATA EXCHANGE USING FAN UNIT SIGNAL LINES

(71) Applicant: LENOVO ENTERPRISE SOLUTIONS (SINGAPORE) PTE. LTD., Singapore (SG)

(72) Inventors: Keith M. Campbell, Cary, NC (US); Christopher L. Wood, Chapel Hill, NC (US); Connor B. Reed, Durham, NC (US); Clifton E. Kerr, Morrisville, NC (US)

(73) Assignee: LENOVO ENTERPRISE SOLUTIONS (SINGAPORE) PTE. LTD., Singapore (SG)

( * ) Notice: Subject to any disclaimer, the term of this patent is extended or adjusted under 35 U.S.C. 154(b) by 295 days.

(21) Appl. No.: 16/916,329

(22) Filed: Jun. 30, 2020

(65) Prior Publication Data
US 2021/0408942 A1    Dec. 30, 2021

(51) Int. Cl.
| | |
|---|---|
| *G06F 1/20* | (2006.01) |
| *H05K 7/20* | (2006.01) |
| *H02P 27/04* | (2016.01) |
| *H02P 27/08* | (2006.01) |
| *H02P 29/024* | (2016.01) |
| *H02P 29/028* | (2016.01) |

(52) U.S. Cl.
CPC .............. *G06F 1/206* (2013.01); *H02P 27/04* (2013.01); *H02P 27/08* (2013.01); *H02P 29/024* (2013.01); *H02P 29/028* (2013.01); *H05K 7/20136* (2013.01); *H05K 7/20209* (2013.01)

(58) Field of Classification Search
CPC .... H02P 7/00; H02P 7/05; H02P 7/245; H02P 7/265; H02P 7/2805; H02P 7/2815; H02P 7/29; H02P 7/2913; H02P 7/2985; H02P 7/325; H02P 29/00; H02P 29/60; H02P 1/00; H02P 1/18; H02P 1/24; H02P 1/42; H02P 1/46; H02P 1/465; H02P 3/00; H02P 6/00; H02P 6/04; H02P 6/06; H02P 6/08; H02P 6/12; H02P 6/26; H02P 6/32; H02P 21/00; H02P 21/0003; H02P 21/0021; H02P 21/18; H02P 23/00; H02P 23/14; H02P 25/00; H02P 25/032; H02P 25/0805; H02P 27/00; H02P 27/08; H02P 27/06

See application file for complete search history.

(56) References Cited

U.S. PATENT DOCUMENTS 7,141,950 B1 *  11/2006  Verge ................. H05K 7/20209
                                                       318/400.29

OTHER PUBLICATIONS

Onsemi, "Intelligent Temperature Monitor and Dual PWM Fan Controller", On Semiconductor, Semiconductor Components Industries, LLC, Publication Order No. ADM1031/D, https://www.onsemi.com/pub/Collateral/ADM1031-D.PDF, dated Apr. 2012, 32 pages.

* cited by examiner

*Primary Examiner* — Antony M Paul

(57) ABSTRACT

Data exchange using fan unit signal lines is disclosed, including receiving a pulse width modulated (PWM) signal on a PWM signal line of a fan unit; detecting that a frequency of the PWM signal is outside a frequency range used to control a fan speed of a fan in the fan unit; selecting a data output based on the frequency of the PWM signal; and sending the data output on a tachometric signal line of the fan unit.

20 Claims, 6 Drawing Sheets

DATA EXCHANGE USING FAN UNIT SIGNAL LINES

BACKGROUND

Field of the Invention

The field of the invention is data processing, or, more specifically, methods, apparatus, and products for data exchange using fan unit signal lines.

Description of Related Art

Fans in computer systems, including large-scale rack server systems, are used to regulate the temperature of elements within the systems. The fans typically have an input mechanism by which a computer system is able to control the fan speed of the fan. Some fans also include an output mechanism that provides a signal with a frequency proportional to speed of the fan.

SUMMARY

Methods, systems, and apparatus for data exchange using fan unit signal lines. Data exchange using fan unit signal lines includes receiving a pulse width modulated (PWM) signal on a PWM signal line of a fan unit; detecting that a frequency of the PWM signal is outside a frequency range used to control a fan speed of a fan in the fan unit; selecting a data output based on the frequency of the PWM signal; and sending the data output on a tachometric signal line of the fan unit.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION

Figure 1:
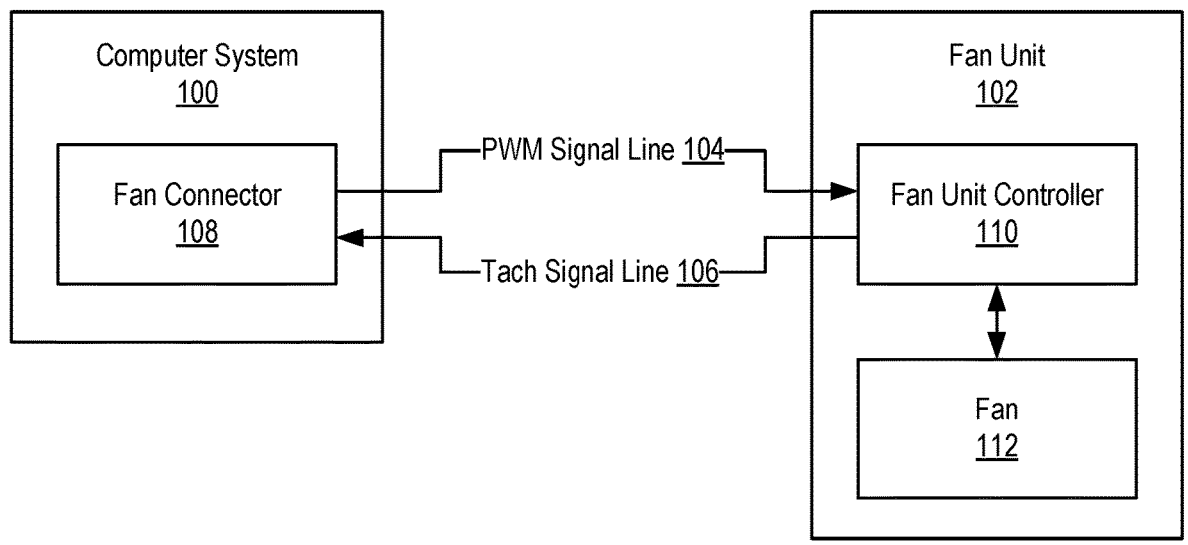
FIG. 1 sets forth a block diagram of an example system configured for data exchange using fan unit signal lines according to embodiments of the present invention.

FIG. 1 shows an exemplary system for data exchange using fan unit signal lines according to embodiments of the present invention. As shown in FIG. 1, the exemplary system includes a computer system (100) operatively coupled to a fan unit (102). The computer system (100) and fan unit (102) are coupled via a pulse width modulation (PWM) signal line (104) and a tachometric (tach) signal line (106) between the fan connector (108) within the computer system (100) and a fan unit controller (110) within the fan unit (102). The fan unit (102) also includes a fan (112).

The computer system (100) may include at least one computer processor as well as random access memory which is connected to the computer processor and to other components of the computing system (152). The computer system (100) may be a baseboard management controller. The fan connector (108) is a mechanism by which the computer system (100) is coupled to the fan unit (102). The fan connector (108) includes connections for a PWM signal line (104) and a tach signal line (106). The fan connector (108) may also include pins to provide power to the fan unit (102).

The fan unit (102) is a device used to regulate the temperature of computing components within a computer system. The fan unit (102) includes a fan (112) to force air over the target computing components. The speed of the fan (112) is controlled by the fan unit controller (110). The fan unit controller (110) is a combination of hardware and software configured to control the power supplied to the fan (112) and the speed at which the fan (112) spins. The fan unit controller (110) may itself be a computer system, such as a microcontroller. The fan unit controller (110) receives input PWM signals from the PWM signal line (104) and, based on the frequency of the PWM signal, sets the speed of the fan (112). The fan unit controller (110) also provides, via the tach signal line (106), a tach signal that indicates the current speed of the fan (112) (e.g., a signal with a frequency proportional to speed of the fan (112)).

The fan unit controller (110) may be configured to regulate the speed of the fan (112) based on input PWM signals within a particular frequency range. For example, if the fan unit controller (110) detects a PWM signal at the low end of the frequency range, then the fan unit controller (110) may set the fan speed to a lower setting. Similarly, if the fan unit controller (110) detects a PWM signal at the high end of the frequency range, then the fan unit controller (110) may set the fan speed to a higher setting.

The PWM signal line (104) is a medium over which a PWM signal is transmitted from the fan connector (100) to the fan unit (102). The PWM signal may be used by the computer system (100) to control the fan speed of the fan unit (102). The tach signal line (106) is a medium over which a tach signal is transmitted from the fan unit (102) to the fan connector (100). The tach signal may be used by the computer system (100) to read the current speed at which the fan (112) in the fan unit (102) is spinning.

The PWM signal line (104) and the tach signal line (106) may, in a rudimentary way, be used to gather information about the fan unit (102) (e.g., if physical inspection is difficult or time consuming). The computer system (100) may send a series of PWM signals to the fan unit (102) and read each resulting tach signal transmitted from the fan unit (102). Based on the combinations of PWM signals sent to the fan unit (102) and the received tach signals sent from the fan unit (102), the computer system (100) may be able to identify the type of fan unit and an estimation of the capabilities of the fan unit. However, specific information about the fan unit (102), such as manufacturer and serial number, are not ascertainable using this process.

The fan unit controller (110) may be reconfigured to receive requests for information over the PWM signal line (104) and provide the requested information over the tach signal line (106). Specifically, the fan unit controller (110)

may include the ability to recognize PWM signals outside of the frequency range used to control the fan speed (e.g., PWM signals of a higher frequency). Higher or lower frequency signals may be mapped to a data output, such as manufacturer or serial number. The data output may then be sent to the computer system (100) by encoding the information in a tach signal sent on the tach signal line (106). For example, the fan unit controller (110) may interpret pulses shorter than a minimum clock width as encoded commands from PWM signal line (104) and switch the tach response from a traditional tach signal to an encoded response when appropriate.

A fan unit (102) with a fan unit controller (110) as configured above may not require hardware changes to the computer system (100) or to the fan connector (108). Therefore, such a fan unit (102) may be used in legacy computer systems whether or not those systems utilize all functions. Further, software changes in the computer system (100) would be sufficient to utilize additional functionality of the fan unit (102). The computer system (100) (such as a baseboard management controller) may only need to be updated to send PWM signals at a higher or lower frequency and to recognize and read the data output from the tach signal line (106).

Figure 2:
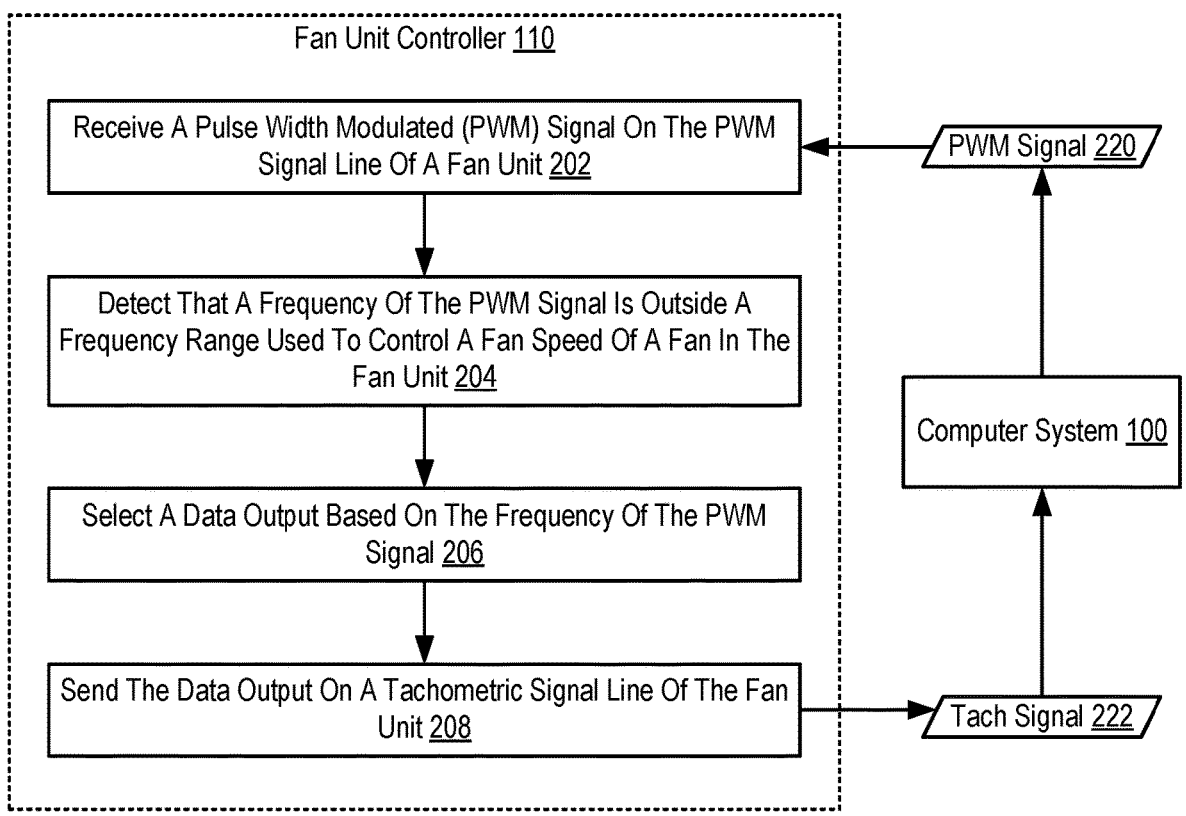
FIG. 2 sets forth a flow chart illustrating an exemplary method for data exchange using fan unit signal lines according to embodiments of the present invention.

For further explanation, FIGS. 2-5 set forth flow charts illustrating exemplary methods used by a fan unit for data exchange using fan unit signal lines. FIG. 2 sets forth a flow chart illustrating an exemplary method for data exchange using fan unit signal lines according to embodiments of the present invention that includes receiving (202) a pulse width modulated (PWM) signal (220) on a PWM signal line of a fan unit. Receiving (202) a pulse width modulated (PWM) signal (220) on a PWM signal line of a fan unit may be carried out by the fan unit controller (110) reading the PWM signal line and determining that a PWM signal (220) is present on the PWM signal line or has changed from a previous PWM signal. The PWM signal (220) may be received from a computer system (100) such as a baseboard management controller. The PWM signal (220) may be, for example, a burst of high frequency clock cycles.

The method of FIG. 2 further includes detecting (204) that a frequency of the PWM signal (220) is outside a frequency range used to control a fan speed of a fan in the fan unit (102). Detecting (204) that a frequency of the PWM signal (220) is outside a frequency range used to control a fan speed of a fan in the fan unit may be carried out by the fan unit controller (110) detecting the particular frequency of the incoming PWM signal (220) is higher, lower, or otherwise unassociated with a frequency range or frequency ranges used to control the fan speed.

Detecting (204) that a frequency of the PWM signal (220) is outside a frequency range used to control a fan speed of a fan in the fan unit may also be carried out by maintaining a current fan speed until a subsequent PWM signal is received on the PWM signal line. Once the fan unit controller (110) determines that the frequency of the incoming PWM signal (220) is not associated with a frequency used to change the fan speed, the fan unit controller (110) may keep the current fan speed unchanged while selecting the data output. In other words, the incoming PWM signal (220) outside of the frequency used to change the fan speed may not result in a disruption to the current fan operation.

The method of FIG. 2 further includes selecting (206) a data output based on the frequency of the PWM signal (220). Selecting (206) a data output based on the frequency of the PWM signal (220) may be carried out by the fan unit controller (110) matching the incoming PWM signal (220) frequency to the data output. The fan unit controller (110) may include a single data output for a frequency that is outside the range of frequency used to control the fan speed. Alternatively, the data output may be one of many data outputs each mapped to a different incoming PWM signal (220) frequency. For example, the fan unit controller (110) may utilize a table that maps PWM signal (220) frequencies to different data outputs.

The data output or outputs may include a variety of types of data. For example, the data output may include an identifier of the fan unit. The identifier of the fan unit may include, for example, the serial number of the fan unit, the model number of the fan unit, and/or the manufacturer of the fan unit. As another example, the data output may include descriptions of the fan unit such as, for example, the physical dimensions of the fan unit, the capabilities of the fan unit, the maximum fan speed of the fan unit, the minimum fan speed of the fan unit, the power requirements of the fan unit, and/or the airflow of the fan unit. The data output may also include dynamic data and errors as described below.

The method of FIG. 2 further includes sending (208) the data output on a tachometric signal line of the fan unit. Sending (208) the data output on a tachometric signal line of the fan unit may be carried out by the fan unit controller (110) encoding the data output within the tach signal (222) on the tachometric signal line. The data output may be preceded by an indication that the data output is forthcoming (such as a header of the data output) and that the standard tachometric output will be interrupted. The data output may be also be followed by an indication that the data output is complete (such as a trailer of the data output) and that the standard tachometric output will be resumed. The data output may also include metadata about the data output such as, for example, the length of the message, error correcting code, and a timestamp.

Sending (208) the data output on a tachometric signal line of the fan unit may also be carried out by interrupting tachometric pulses indicating the fan speed on the tachometric signal line. The tachometric signal line may be in use to indicate the current fan speed to the computer system (100). The current fan speed indication signal may be paused while the data output is sent on the tachometric signal line. After the data output is successfully transmitted, the current fan speed indication signal may be resumed.

Figure 3:
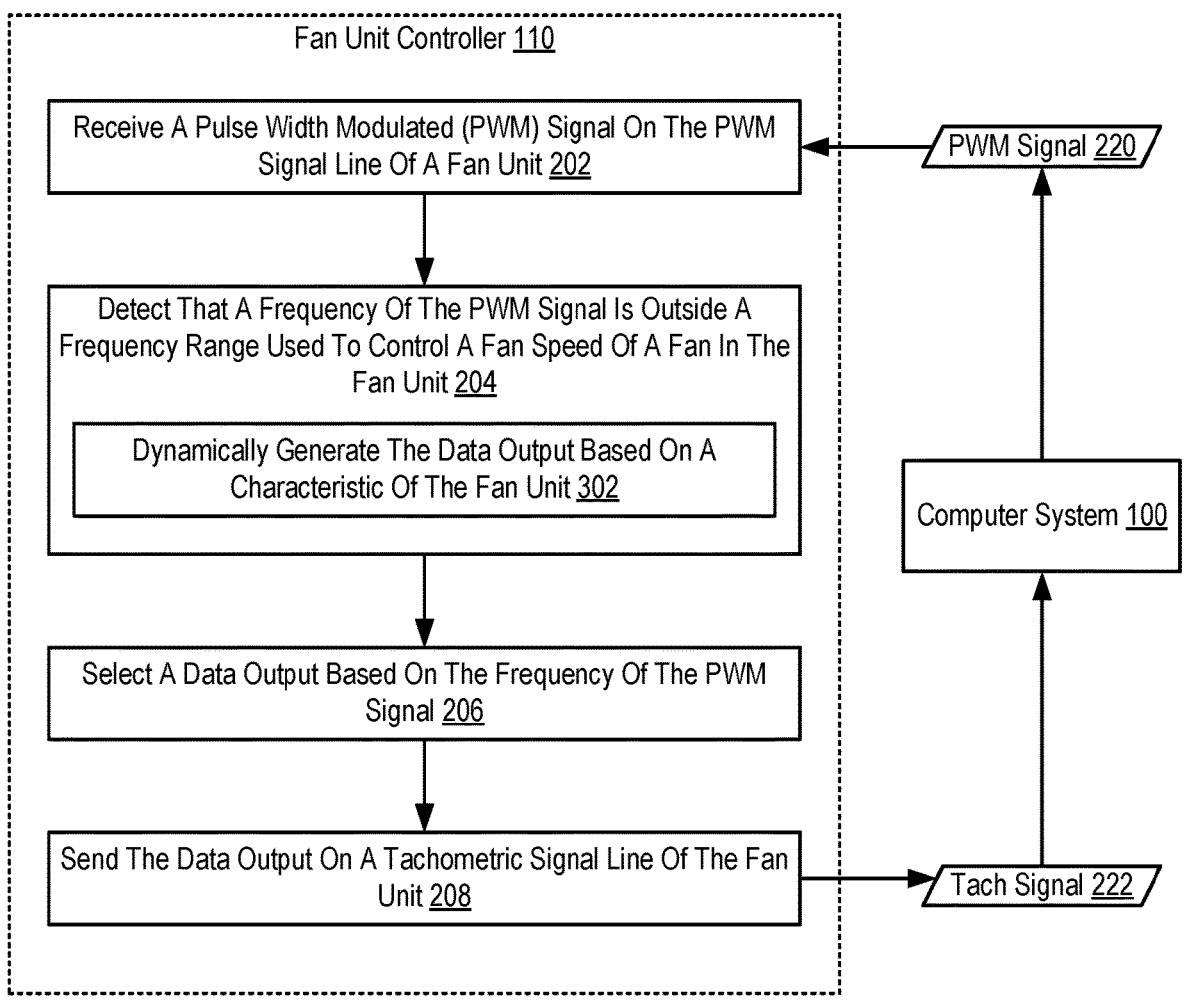
FIG. 3 sets forth a flow chart illustrating an exemplary method for data exchange using fan unit signal lines according to embodiments of the present invention.

For further explanation, FIG. 3 sets forth a flow chart illustrating a further exemplary method for data exchange using fan unit signal lines according to embodiments of the present invention that includes receiving (202) a pulse width modulated (PWM) signal (220) on a PWM signal line of a fan unit; detecting (204) that a frequency of the PWM signal (220) is outside a frequency range used to control a fan speed of a fan in the fan unit; selecting (206) a data output based on the frequency of the PWM signal (220); and sending (208) the data output on a tachometric signal line of the fan unit.

The method of FIG. 3 differs from the method of FIG. 2, however, in that detecting (204) that a frequency of the PWM signal (220) is outside a frequency range used to control a fan speed of a fan in the fan unit includes dynamically generating (302) the data output based on a characteristic of the fan unit. Dynamically generating (302) the data output based on a characteristic of the fan unit may be carried out by the fan unit controller (110) mapping the incoming PWM signal (220) frequency to an instruction set that is used by the fan unit controller (110) to generate the data output. Dynamically generated data output is a data output that is created contemporaneously with the request for the data output. The instruction set may indicate the process by which the data output is generated. This process may include obtaining readings from sensors, such as temperature sensors and clocks. For example, dynamically generated data output may include hours in operation, temperature of the fan unit, and incoming air temperature.

Figure 4:
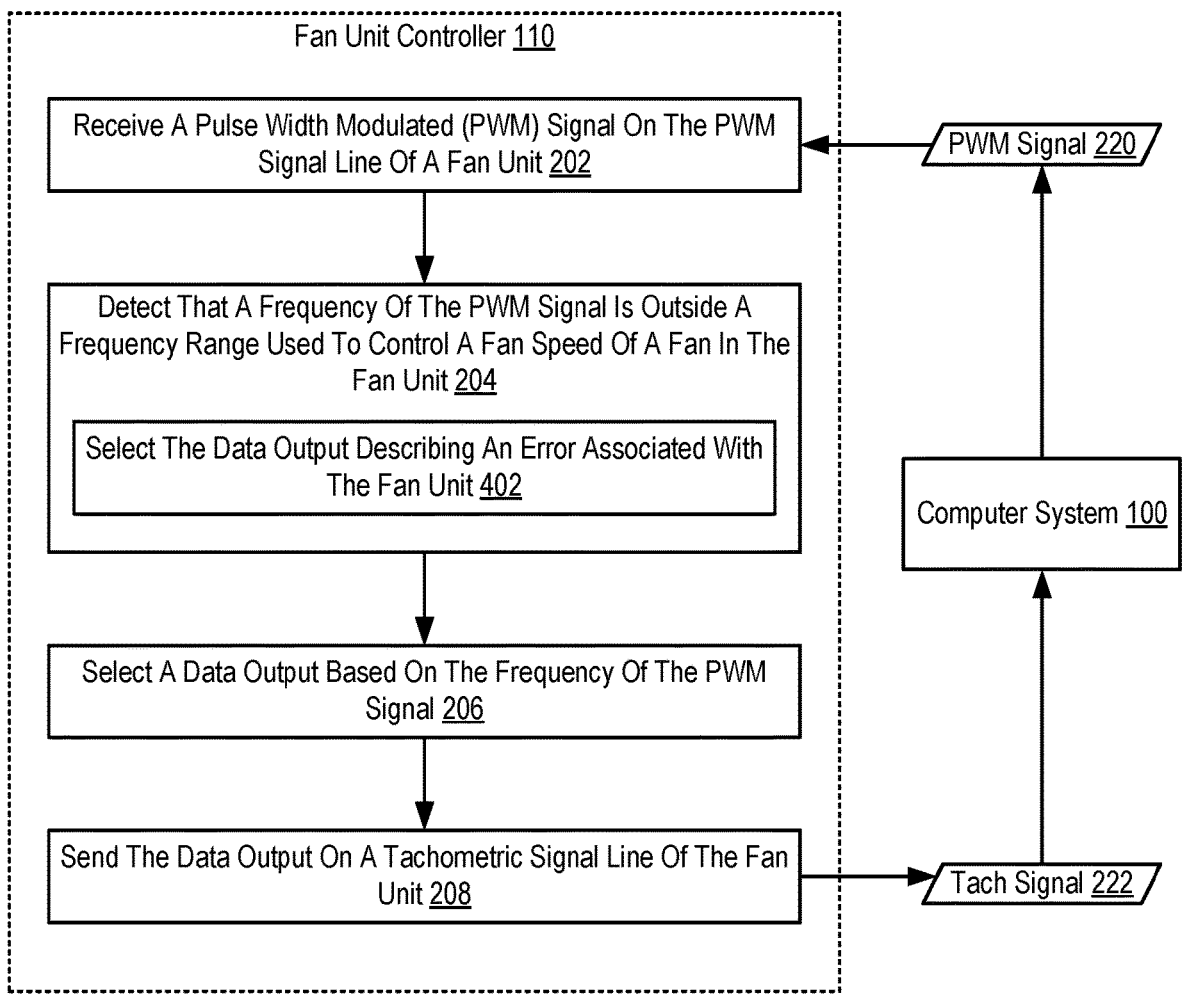
FIG. 4 sets forth a flow chart illustrating an exemplary method for data exchange using fan unit signal lines according to embodiments of the present invention.

For further explanation, FIG. 4 sets forth a flow chart illustrating a further exemplary method for data exchange using fan unit signal lines according to embodiments of the present invention that includes receiving (202) a pulse width modulated (PWM) signal (220) on a PWM signal line of a fan unit; detecting (204) that a frequency of the PWM signal (220) is outside a frequency range used to control a fan speed of a fan in the fan unit; selecting (206) a data output based on the frequency of the PWM signal (220); and sending (208) the data output on a tachometric signal line of the fan unit.

The method of FIG. 4 differs from the method of FIG. 2, however, in that detecting (204) that a frequency of the PWM signal (220) is outside a frequency range used to control a fan speed of a fan in the fan unit includes selecting (402) the data output describing an error associated with the fan unit. Selecting (402) the data output describing an error associated with the fan unit may be carried out by the fan unit controller (110) detecting that the incoming PWM signal frequency is mapped to a request for one or more errors recorded by the fan unit controller (110). Errors may be tracked and stored by the fan unit controller (110). The incoming PWM signal frequency may be interpreted, for example, as a request for one error, all errors, a particular type of error, or the total number of errors. A description of the requested error or errors may then be encoded as the tach signal (222) on the tach signal line. Examples of errors include errors related to fan vibration, errors related to the ratio of power consumption to fan output, and errors related to temperature sensors.

Figure 5:
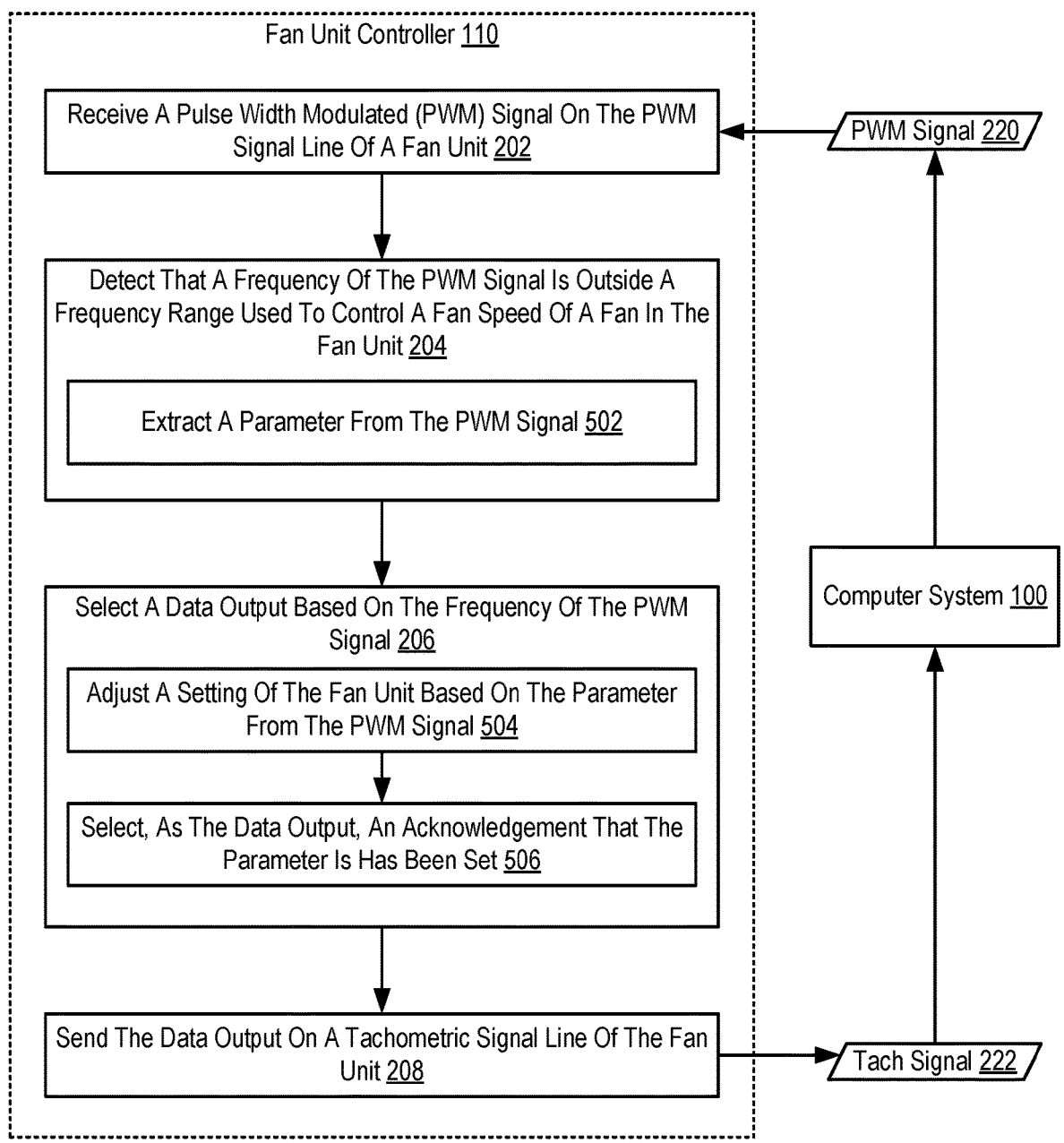
FIG. 5 sets forth a flow chart illustrating an exemplary method for data exchange using fan unit signal lines according to embodiments of the present invention.

For further explanation, FIG. 5 sets forth a flow chart illustrating a further exemplary method for data exchange using fan unit signal lines according to embodiments of the present invention that includes receiving (202) a pulse width modulated (PWM) signal (220) on a PWM signal line of a fan unit; detecting (204) that a frequency of the PWM signal (220) is outside a frequency range used to control a fan speed of a fan in the fan unit; selecting (206) a data output based on the frequency of the PWM signal (220); and sending (208) the data output on a tachometric signal line of the fan unit.

The method of FIG. 5 differs from the method of FIG. 2, however, in that detecting (204) that a frequency of the PWM signal (220) is outside a frequency range used to control a fan speed of a fan in the fan unit includes extracting (502) a parameter from the PWM signal (220). Extracting (502) a parameter from the PWM signal (220) may be carried out by the fan unit controller (110) determining that the PWM signal (220) includes an input parameter for use by the fan unit. The incoming PWM signal (220) may also indicate the type of parameter that has been provided. For example, the incoming PWM signal (220) may include a parameter for the maximum fan speed, minimum fan speed, fan rotation pattern, vibration tolerance, and temperature tolerance.

The method of FIG. 5 also differs from the method of FIG. 2 in that selecting (206) a data output based on the frequency of the PWM signal (220) includes adjusting (504) a setting of the fan unit based on the parameter from the PWM signal (220); and selecting (506), as the data output, an acknowledgement that the parameter is has been set. Adjusting (504) a setting of the fan unit based on the parameter from the PWM signal (220) may be carried out by the fan unit controller (110) substituting the parameter from the PWM signal (220) with a setting of the fan unit. Selecting (506), as the data output, an acknowledgement that the parameter is has been set may be carried out by the fan unit controller (110) generating or accessing an acknowledgement message and encoding the message as the data output on the tach signal (222).

Figure 6:
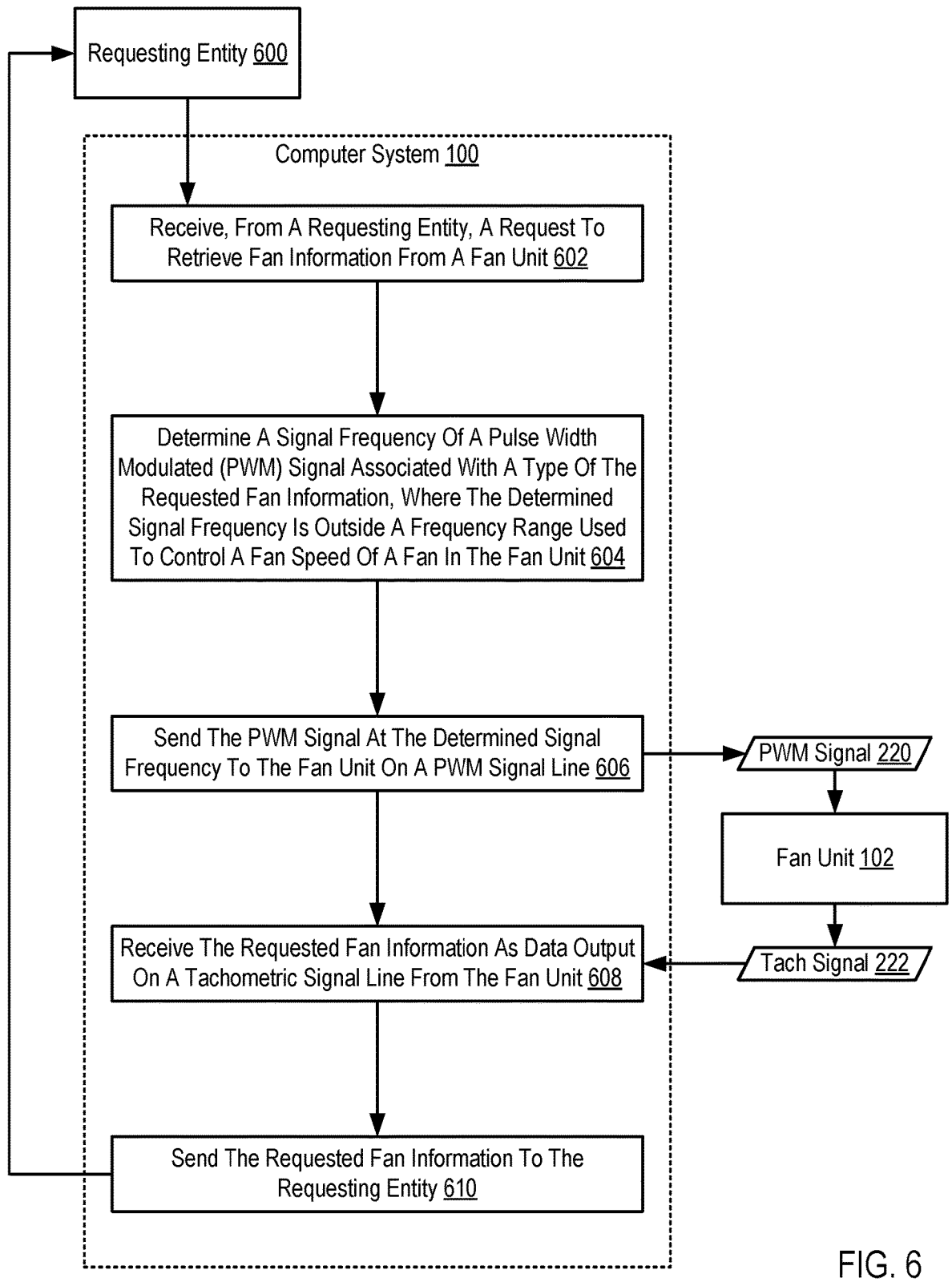
FIG. 6 sets forth a flow chart illustrating an exemplary method for data exchange using fan unit signal lines according to embodiments of the present invention.

For further explanation, FIG. 6 sets forth a flow chart illustrating an exemplary method for data exchange using fan unit signal lines according to embodiments of the present invention that includes receiving (602), from a requesting entity (600), a request to retrieve fan information from a fan unit (102). Receiving (602), from a requesting entity (600), a request to retrieve fan information from a fan unit (102) may be carried out by the computer system (100) interacting with the requesting entity (600) and obtaining the request for fan information. The requesting entity (600) may be a system monitoring program monitoring the temperature of the system being cooled by the fan unit (102). The computer system (100) may be under the control of the requesting entity (600), such as a system monitoring program using a baseboard management controller. The fan information may be static information (as described in FIG. 2), dynamic information (as described in FIG. 3), error information (as described in FIG. 4), or information and a parameter (as described in FIG. 5).

The method of FIG. 6 further includes determining (604) a signal frequency of a pulse width modulated (PWM) signal (220) associated with a type of the requested fan information, wherein the determined signal frequency is outside a frequency range used to control a fan speed of a fan in the fan unit (102). Determining (604) a signal frequency of a pulse width modulated (PWM) signal (220) associated with a type of the requested fan information, wherein the determined signal frequency is outside a frequency range used to control a fan speed of a fan in the fan unit (102) may be carried out by the computer system (100) accessing a table that maps the requested fan information to a PWM signal frequency.

The method of FIG. 6 further includes sending (606) the PWM signal (220) at the determined signal frequency to the fan unit (102) on a PWM signal line. Sending (606) the PWM signal (220) at the determined signal frequency to the fan unit (102) on a PWM signal line may be carried out by the computer system (100) interrupting the current PWM signal sent to the fan unit (102), generating the PWM signal (220) at the determined signal frequency for sending the request for the fan information, and placing the PWM signal (220) on the PWM signal line to the fan unit (102).

The method of FIG. 6 further includes receiving (608) the requested fan information as data output on a tachometric signal line from the fan unit (102). Receiving (608) the requested fan information as data output on a tachometric signal line from the fan unit (102) may be carried out by the computer system (100) detecting that the tach signal (222) on the tachometric signal line indicating the fan speed has been interrupted to produce the data output that includes the requested fan information.

The method of FIG. 6 further includes sending (610) the requested fan information to the requesting entity (600). Sending (610) the requested fan information to the requesting entity (600) may be carried out by the computer system (100) interacting with the requesting entity (600) and providing the requested fan information.

In view of the explanations set forth above, readers will recognize that the benefits of data exchange using fan unit signal lines according to embodiments of the present invention include:

Improving the operation of a fan unit by adding two-way communication between a fan unit and a computer system, increasing the fan unit utility.

Improving the operation of a fan unit without additional complexity or hardware, increasing the fan unit usability.

Exemplary embodiments of the present invention are described largely in the context of a fully functional computer system for data exchange using fan unit signal lines. Readers of skill in the art will recognize, however, that the present invention also may be embodied in a computer program product disposed upon computer readable storage media for use with any suitable data processing system. Such computer readable storage media may be any storage medium for machine-readable information, including magnetic media, optical media, or other suitable media. Examples of such media include magnetic disks in hard drives or diskettes, compact disks for optical drives, magnetic tape, and others as will occur to those of skill in the art. Persons skilled in the art will immediately recognize that any computer system having suitable programming means will be capable of executing the steps of the method of the invention as embodied in a computer program product. Persons skilled in the art will recognize also that, although some of the exemplary embodiments described in this specification are oriented to software installed and executing on computer hardware, nevertheless, alternative embodiments implemented as firmware or as hardware are well within the scope of the present invention.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A fan unit comprising:
   a fan;
   a pulse width modulated (PWM) signal line;
   a tachometric signal line; and
   a fan unit controller configured to:
      receiving a PWM signal on the PWM signal line;
      detecting that a frequency of the PWM signal is outside a frequency range used to control a fan speed of the fan;
      selecting a data output based on the frequency of the PWM signal; and
      sending the data output on the tachometric signal line.

2. The fan unit of claim 1, wherein the data output comprises an identifier of the fan unit.

3. The fan unit of claim 1, wherein selecting the data output based on the frequency of the PWM signal comprises dynamically generating the data output based on a characteristic of the fan unit.

4. The fan unit of claim 1, wherein selecting the data output based on the frequency of the PWM signal comprises selecting the data output describing an error associated with the fan unit.

5. The fan unit of claim 1, wherein detecting that the frequency of the PWM signal is outside the frequency range used to control the fan speed of the fan comprises maintaining a current fan speed until a subsequent PWM signal is received on the PWM signal line.

6. The fan unit of claim 1, wherein sending the data output on the tachometric signal line comprises interrupting tachometric pulses indicating the fan speed on the tachometric signal line.

7. The fan unit of claim 1, wherein detecting that the frequency of the PWM signal is outside the frequency range used to control the fan speed of the fan comprises extracting a parameter from the PWM signal.

8. The fan unit of claim 7, wherein selecting the data output based on the frequency of the PWM signal comprises:
   adjusting a setting of the fan unit based on the parameter from the PWM signal; and
   selecting, as the data output, an acknowledgement that the parameter is has been set.

9. The fan unit of claim 1, wherein the PWM signal line and the tachometric signal line are communicatively coupled to a baseboard management controller.

10. A computer program product including a computer readable medium, the computer program product comprising computer program instructions that, when executed, cause a computer to carry out the steps of:
    receiving a pulse width modulated (PWM) signal on a PWM signal line of a fan unit;
    detecting that a frequency of the PWM signal is outside a frequency range used to control a fan speed of a fan in the fan unit;
    selecting a data output based on the frequency of the PWM signal; and
    sending the data output on a tachometric signal line of the fan unit.

11. The computer program product of claim 10, wherein the data output comprises an identifier of the fan unit.

12. The computer program product of claim 10, wherein selecting the data output based on the frequency of the PWM signal comprises dynamically generating the data output based on a characteristic of the fan unit.

13. The computer program product of claim 10, wherein selecting the data output based on the frequency of the PWM signal comprises selecting the data output describing an error associated with the fan unit.

14. The computer program product of claim 10, wherein detecting that the frequency of the PWM signal is outside the frequency range used to control the fan speed of the fan comprises maintaining a current fan speed until a subsequent PWM signal is received on the PWM signal line.

15. The computer program product of claim 10, wherein sending the data output on the tachometric signal line comprises interrupting tachometric pulses indicating the fan speed on the tachometric signal line.

16. The computer program product of claim 15, wherein the fan information is an identifier of the fan unit.

17. The computer program product of claim 10, wherein detecting that the frequency of the PWM signal is outside the frequency range used to control the fan speed of the fan comprises extracting a parameter from the PWM signal.

18. The computer program product of claim 17, wherein selecting the data output based on the frequency of the PWM signal comprises:
    adjusting a setting of the fan unit based on the parameter from the PWM signal; and
    selecting, as the data output, an acknowledgement that the parameter is has been set.

19. The computer program product of claim 10, wherein the PWM signal line and the tachometric signal line are communicatively coupled to a baseboard management controller.

20. A computer program product including a computer readable medium, the computer program product comprising computer program instructions that, when executed, cause a computer to carry out the steps of:
    receiving, from a requesting entity, a request to retrieve fan information from a fan unit;

determining a signal frequency of a pulse width modulated (PWM) signal associated with a type of the requested fan information, wherein the determined signal frequency is outside a frequency range used to control a fan speed of a fan in the fan unit;
sending the PWM signal at the determined signal frequency to the fan unit on a PWM signal line;
receiving the requested fan information as data output on a tachometric signal line from the fan unit; and
sending the requested fan information to the requesting entity.

* * * * *